United States Patent
Fan

(10) Patent No.: US 7,479,704 B2
(45) Date of Patent: Jan. 20, 2009

(54) SUBSTRATE IMPROVING IMMOBILIZATION OF BALL PADS FOR BGA PACKAGES

(75) Inventor: Wen-Jeng Fan, Hsinchu (TW)

(73) Assignee: Powertech Technology Inc., Hukou Shiang, Hsinchu (TW)

( * ) Notice: Subject to any disclaimer, the term of this patent is extended or adjusted under 35 U.S.C. 154(b) by 0 days.

(21) Appl. No.: 11/651,610

(22) Filed: Jan. 10, 2007

(65) Prior Publication Data

US 2008/0164610 A1 Jul. 10, 2008

(51) Int. Cl.
*H01L 23/48* (2006.01)
(52) U.S. Cl. .............. 257/780; 257/773; 257/738; 257/700; 257/E23.174
(58) Field of Classification Search .......... 257/780, 257/E23.174
See application file for complete search history.

(56) References Cited

U.S. PATENT DOCUMENTS

| | | | | |
|---|---|---|---|---|
| 6,515,361 | B2* | 2/2003 | Lee et al. ............ | 257/738 |
| 2002/0100976 | A1* | 8/2002 | Hui et al. ............ | 257/738 |
| 2003/0114023 | A1* | 6/2003 | Kung et al. ............ | 439/68 |
| 2003/0214030 | A1* | 11/2003 | Bodas ............ | 257/734 |
| 2005/0230824 | A1* | 10/2005 | Watanabe et al. ............ | 257/735 |
| 2006/0099737 | A1* | 5/2006 | Ohuchi ............ | 438/108 |

* cited by examiner

*Primary Examiner*—Tu-Tu V Ho
(74) *Attorney, Agent, or Firm*—Troxell Law Office, PLLC

(57) ABSTRACT

A substrate improving immobilization of ball pads for BGA packages mainly comprises a substrate core, a plurality of ball pads and a solder resist layer. Each of the ball pads has a metal pad and at least a metal nail. The metal pads are adhered on a surface of the substrate core and the metal nails are embedded into but not penetrate the substrate core. The solder resist layer is formed over the substrate core and exposes the metal pads. By utilizing the shapes of the ball pads to increase bonding area between the ball pads and the substrate core, a separation or crack occurring at the interface between the metal pads and the substrate core can be substantially avoided.

11 Claims, 4 Drawing Sheets

SUBSTRATE IMPROVING IMMOBILIZATION OF BALL PADS FOR BGA PACKAGES

FIELD OF THE INVENTION

The present invention is relating to a circuit substrate suitable for semiconductor packages, more particularly to a substrate improving immobilization of ball pads for BGA (Ball Grid Array) packages.

BACKGROUND OF THE INVENTION

Referring to FIG. 1, a conventional BGA package substrate 100 is generally applied for carrying chip in well-known BGA packages and mainly comprises a substrate core 110, a plurality of ball pads 120 and a solder resist layer 130. The substrate core 110 has a surface 111, the ball pads 120 are disposed on the surface 111 of the substrate core 110, and the solder resist layer 130 is formed over the surface 111 of the substrate core 110 without covering the ball pads 120. Additionally, a plurality of traces 140 are disposed on the surface 111 of the substrate core 110 to connect the ball pads 120 and encapsulated by the solder resist layer 130.

In addition to the substrate 100, the known BGA package further comprises a plurality of solder balls 210, a chip 220 and an encapsulant 230. The solder balls 210 are mounted onto the ball pads 120 of the BGA package substrate 100. The chip 220 is disposed on the BGA package substrate 100 and has a plurality of bonding pads 221. The bonding pads 221 are further connected to the fingers of the traces 140 on the BGA package substrate 100 for connecting a plurality of bonding wires 240 formed by wire-bonding method. The encapsulant 230 encapsulates the chip 220 and the bonding wires 240. The solder balls 210 are applied for mounting the BGA package to an external printed circuit board 250. Referring to FIG. 2, the circuit board 250 has a plurality of ball-mounting pads 251 and a solder resist layer 252 formed thereon. The solder balls 210 are reflowed to bond to the corresponding ball-mounting pads 251.

However in the known BGA package, disposition of the ball pads 120 will become higher and higher in density, especially for the ball pads 120 of NSMD pad (Non-Solder Mask Defined pad). The periphery of the ball pads 120 are not covered by the solder resist layer 130. The smaller the area of that each of the ball pads 120 occupies the surface 111 of the substrate core 110 is, more inadequate immobilization the ball pads 120 have on the substrate core 110. When a BGA package is connected with SMT to a printed circuit board or a board level temperature cycle test, it is possible to easily cause a separation or crack between the ball pads 120 and the substrate core 110 resulting in serious problems such as bad reliability or component failure.

A BGA package substrate has been disclosed in U.S. Pat. No. 6,201,305 B1, which integrally adds some bar supporters in radial shape extending to inside of the solder resist layer 252 so as to improve immobilization of ball pads. However, the area of that the ball pads occupy the substrate surface will be widely increased by doing in this way, so that it is unsuitable for BGA package substrate with high density disposition and may further affect wiring disposition of BGA package substrate.

SUMMARY OF THE INVENTION

A primary object of the present invention is to provide a substrate for improving immobilization of ball pads for BGA packages, which won't cause separation or crack at the mounting interface between the ball pads and the substrate core during bearing external stress.

One aspect of the present invention provides a substrate improving immobilization of ball pads for BGA packages mainly comprising a substrate core, a plurality of ball pads and a solder resist layer. The substrate core has a surface and each of the ball pads has a metal pad and at least a metal nail, wherein the metal pads are adhered on the surface of the substrate core and the metal nails are embedded into the substrate core. The solder resist layer is formed over the surface of the substrate core and exposes the metal pads. In addition, a BGA package comprising the substrate is disclosed. With regard to the substrate mentioned above, it may further comprise a plurality of patterned traces disposed on the surface of the substrate core to connect with the metal pads and covered by the solder resist layer.

With regard to the substrate mentioned above, the ball pads may be arranged in an array.

With regard to the substrate mentioned above, the ball pads may be located at a plurality of corners of the surface of the substrate core.

With regard to the substrate mentioned above, the ball pads may be dummy pads without function of electrical transmission.

With regard to the substrate mentioned above, the ball pads may have thumbtack-like shapes.

With regard to the substrate mentioned above, each metal nail may have an embedded length so as not to penetrate the substrate core.

With regard to the substrate mentioned above, the embedded length of the metal nails may range between half and two third of thickness of the substrate core.

With regard to the substrate mentioned above, the metal nails may penetrate the corresponding metal pads.

With regard to the substrate mentioned above, the metal nails may further slightly protrude from the exposed surface of the corresponding metal pads.

With regard to the substrate mentioned above, the metal nails may have shapes selected from the group consisting of round bars, square bars and screws.

With regard to the substrate mentioned above, the metal pads may be completely exposed from the solder resist layer to form NSMD pads.

With regard to the substrate mentioned above, the metal pads may be round pads.

DETAILED DESCRIPTION OF THE INVENTION

Figure 1:
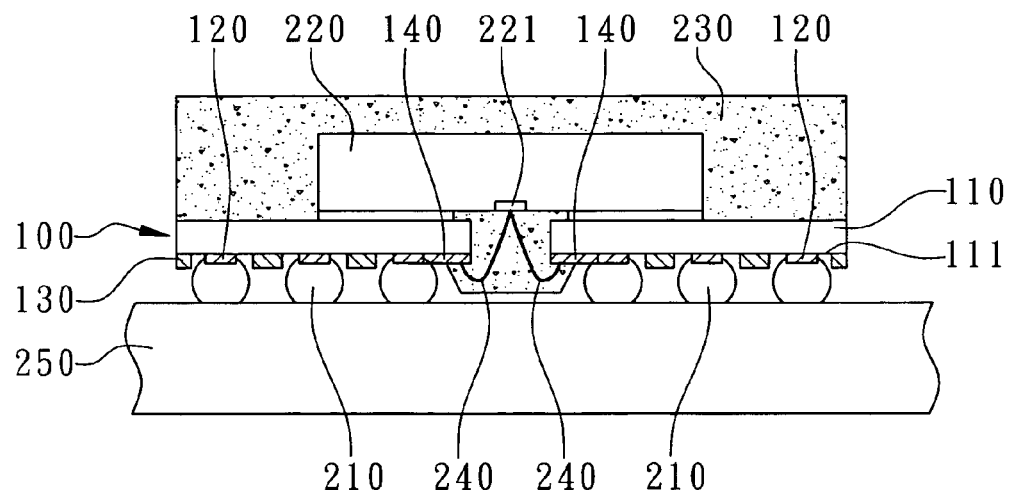
FIG. 1 is a cross-sectional view of a known BGA package after surface mounting.
Figure 2:
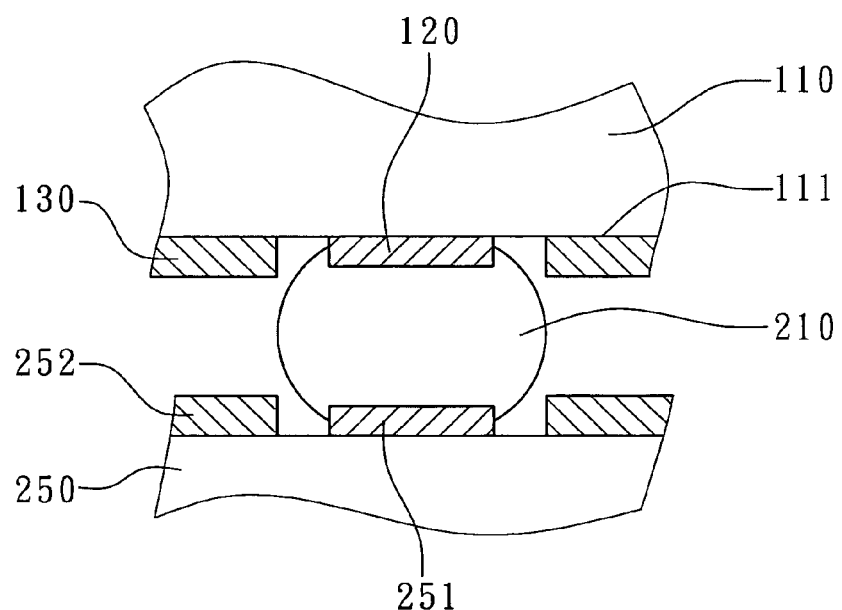
FIG. 2 is a partially cross-sectional view of the known BGA package including a ball pad.
Figure 3:
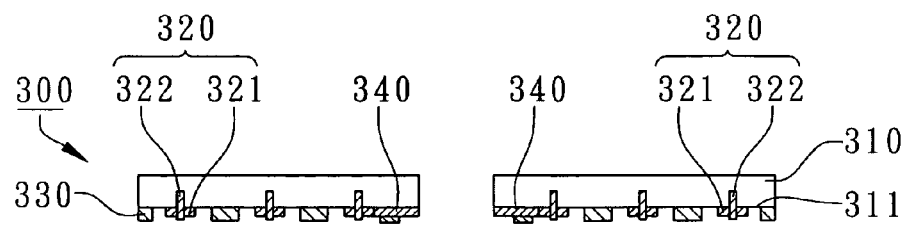
FIG. 3 is a cross-sectional view of a substrate improving immobilization of ball pads for BGA packages in accordance with the first embodiment of the present invention.

A substrate improving immobilization of ball pads for BGA packages is disclosed within the first embodiment of the present invention to function as a chip carrier of semiconductor package. Referring to FIG. 3, the BGA package substrate 300 mainly comprises a substrate core 310, a plurality of ball pads 320 and a solder resist layer 330. In this embodiment, the BGA package substrate 300 has a single layer wiring pattern, which may adopt printed circuit board, ceramic carrier or flexible circuit film. The ball pads 320 can be arranged in an array on a same surface with the substrate core 310. In addition, "a substrate core 310" means at least a layer of substrate core, maybe two, three or more layers are included.

Figure 6:
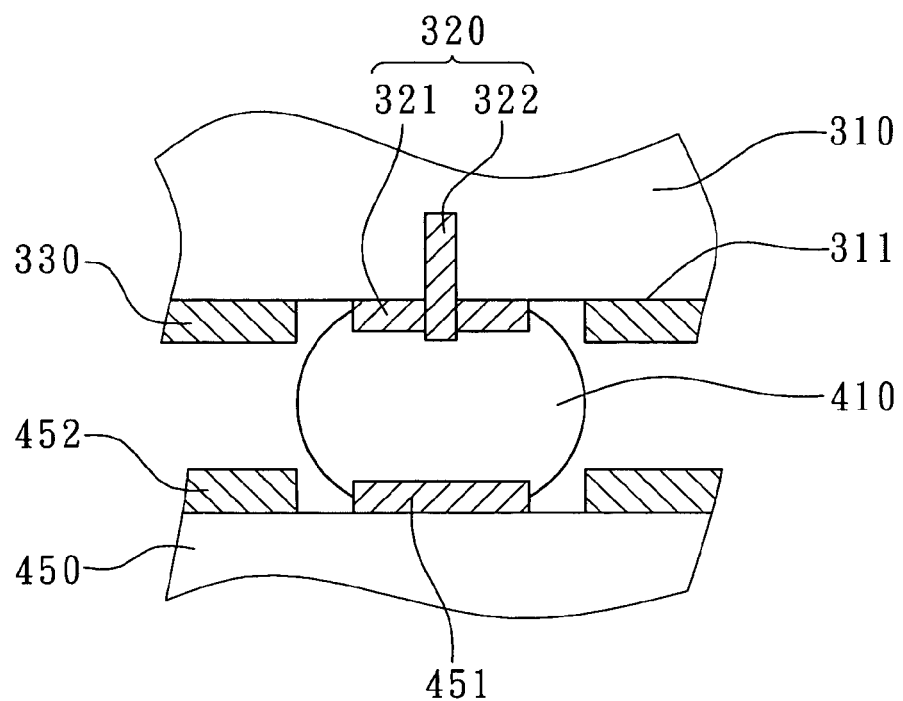
FIG. 6 is a partially cross-sectional view of the BGA package including a ball pad in accordance with the first embodiment of the present invention.

The substrate core 310 has a surface 311 to dispose the ball pads 320 and patterned traces (not showed in the drawings) and form a solder resist layer 330. Referring now to FIG. 6, each of the ball pads 320 has a metal pad 321 that is adhered onto the surface 311 of the substrate core 310 and at least a metal nail 322. The metal pads 321 may be round pads (showed in FIG. 4) and the metal nails 322 are embedded into the substrate core 310. In this embodiment, the ball pads 320 may have thumbtack-like shapes.

Besides, referring to FIG. 3 and FIG. 6, each of the metal nails 322 may have an embedded length so as not to not penetrate the substrate core 310, more specifically, the embedded length of the metal nails 322 embedded into the substrate core 310 may range between half and two third of the thickness of the substrate core 310, so that the metal nails 322 are configured to provide a mechanically immobilizing effect without function of electrical transmission. In fabricating method, prior to pressing and adhering copper foils on the surface 311 of the substrate core 310 to form the metal pads 321, it may form blind holes by laser-drilling at the predetermined locations of forming ball pads on the substrate core 310, and then the blind holes are plated with copper or other conductive metals by plating or immersing method to form the metal nails 322. Further, the copper foils are patterned with etching method to form the metal pads 321 and proper patterned traces. The technique fabricating the metal nails 322 mentioned above is only a unlimited as well as a comparatively operable process, the metal nails 322 is capable of penetrating the corresponding metal pads 321 to enhance coupling strength between the metal nails 322 and the corresponding metal pads 321 in accordance with the fabricating process. In this embodiment, in addition to penetrate the corresponding metal pads 321, the metal nails 322 may further slightly protrude from the exposed surface of the corresponding metal pads 321.

Figure 4:
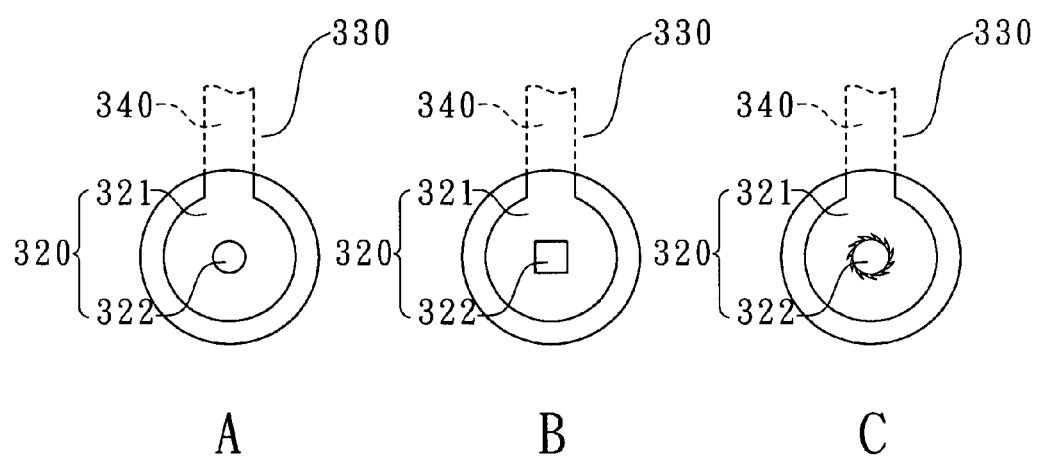
FIG. 4 is a diagram illustrating transformation of a metal nail included within the BGA package substrate in accordance with the first embodiment of the present invention.

The solder resist layer 330 is formed over the substrate core 310 and exposes the metal pads 321, may be a solder mask or other surface protection layer with solder resist characteristic. The contact area between the ball pads 320 and the substrate core 310 is increased due to the shape of the ball pads 320 to provide an excellent coupling immobilization between the ball pads 320 and the substrate core 310, that allows crack, even displacement and separation not to occur easily at coupling interface of the ball pads 320 and the substrate core 310. Referring to FIG. 4, since the openings of the solder resist layer 330 are larger than the metal pads 321 in size, the metal pads 321 may be completely exposed from the solder resist layer 330 to form NSMD pads wherein mounting ability of the solder balls 410 are enhanced and the mounting interface between the metal pads 321 and the substrate core 310 is not vulnerable to damage against external force resulting in separation or crack. The ball pads 320 will be disposed in high density.

Referring to FIG. 4, the BGA package substrate 300 may further comprise a plurality of patterned traces 340 that are adhered on the surface 311 of the substrate core 310, connected with the metal pads 321 and covered by the solder resist layer 330. Referring to FIG. A, B, C in FIG. 4, the metal nails 322 may have shapes selected from the group consisting of round bars, square bars and screws.

Figure 5:
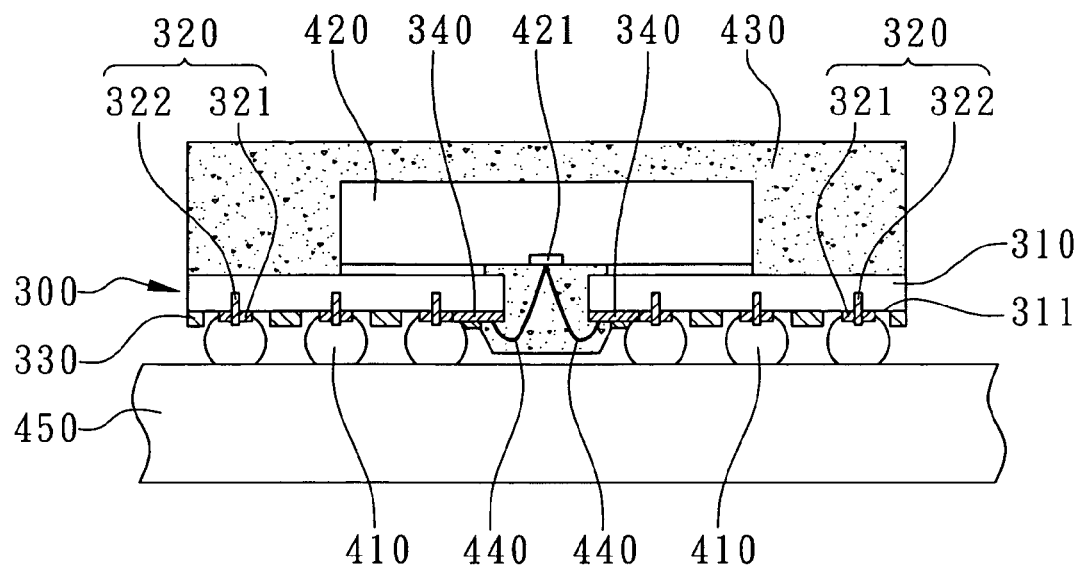
FIG. 5 is a cross-sectional view of a BGA package applying the BGA package substrate in accordance with the first embodiment of the present invention.

The BGA package substrate 300 may further be applied to a BGA package in accordance with the first embodiment of the present invention. Referring to FIG. 5, a BGA package at least comprises a foregoing BGA package substrate 300 having a slot and a plurality of solder balls 410 mounted onto the metal pads 321 of the ball pads 320. The BGA package further comprises a chip 420 disposed on another surface of the BGA package substrate 300 and an encapsulant 430 to encapsulate the chip 420. The chip 420 has a plurality of bonding pads 421, which are electrically connected with the patterned traces 340 on the BGA package substrate 300 via a plurality of bonding wires 440 formed with conventional wire-bonding method to pass through the slot of the BGA package substrate 300. The encapsulant 430 substantially encapsulate the chip 420 and the bonding wires 440. In specific application, the BGA package is mounted to an external printed circuit board 450 via reflowing the solder balls 410.

Referring to FIG. 6, an external printed circuit board 450 has a plurality of ball-mounting pads 451 exposed from the solder resist layer 452. After SMT, the solder balls 410 bonded onto the ball pads 320 are reflowed to mount onto the ball-mounting pads 451. The ball pads 320 provide powerful immobilization on the substrate core 310 without need to expand area of occupying the surface 311 of the substrate core 310, which prevents the mounting interface between the ball pads 320 and the substrate core 310 from damaging against external force resulting in separation or crack.

Figure 7:
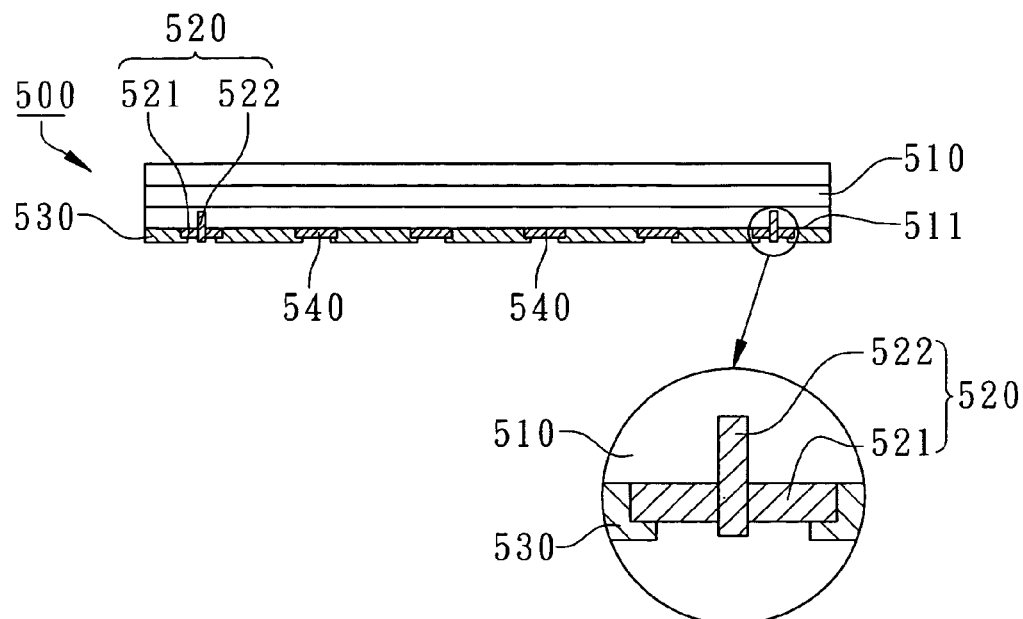
FIG. 7 is a cross-sectional view of another substrate improving immobilization of ball pads for BGA packages in accordance with the second embodiment of the present invention.

In the second embodiment, another substrate improving immobilization of ball pads for BGA packages is disclosed to illustrate that the foregoing ball pads with special shapes can be selectively disposed. Referring now to FIG. 7, the BGA package substrate 500 mainly comprises at least a substrate core 510, a plurality of ball pads 520, 540 and a solder resist layer 530. In this embodiment, partial ball pads marked with reference number "540" may generally be round pads with electrical transmission and partial ball pads marked with reference number "520" may be dummy pads without function of electrical transmission.

Within the partial ball pads 520, each of the ball pads 520 has a metal pad 521 and at least a metal nail 522. The metal pads 521 are disposed on a surface 511 of the substrate core 510 and the metal nails 522 are embedded into the substrate core 510 to improve immobilization on substrate. In this embodiment, the ball pads 540 are arranged in an array. The ball pads 520 can be selectively disposed at a plurality of corners or edges of the surface 511 of the substrate core 510.

The solder resist layer 530 is substantially formed over the substrate core 510 and exposes the metal pads 521 and the ball pads 540. In this embodiment, the solder resist layer 530 may partially encapsulates the periphery of the metal pads 521 to form SMD pads (Solder Mask Defined pads).

Figure 8:
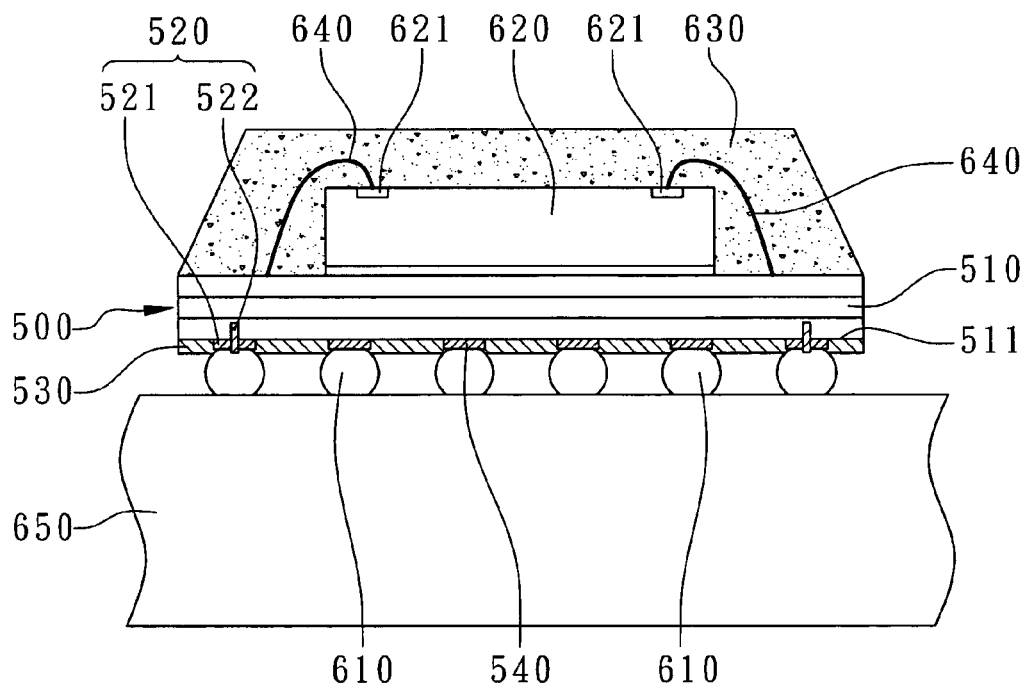
FIG. 8 is a cross-sectional view of a BGA package applying the BGA package substrate in accordance with the second embodiment of the present invention.

FIG. 8 illustrates that the BGA package substrate 500 is applied for a BGA package. The BGA package mainly comprises the foregoing BGA package substrate 500 and a plurality of solder balls 610 coupled onto the metal pads 521 of the ball pads 520 and the ball pads 540. The BGA package further has a chip 620 disposed on another surface of the BGA package substrate 500 and an encapsulant 630. The chip 620 has a plurality of bonding pads 621, which are electrically connected to the BGA package substrate 500 via a plurality of bonding wires 640 formed by conventional wire-bonding method or by flip-chip technique. The encapsulant 630 encapsulates the chip 620 and the bonding wires 640. The BGA package substrate 500 that takes advantage of the ball pads 540 with special shapes to increase contact area of the ball pads 540 and the substrate core 510 without expanding area of that the ball pad 520 occupy the surface 511 of the substrate core 510 can be applied for the BGA package with high density wiring and stand strong external force to prevent separation or crack from occurring at the interface of the ball pads 520 and the substrate core 510.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A substrate for BGA packages comprising:
   a substrate core having a surface;
   a plurality of ball pads, each having a metal pad adhered on the surface of the substrate core and at least a metal nail embedded into the substrate core;
   a solder resist layer formed over the surface of the substrate core and exposing the metal pads; and
   a plurality of patterned traces disposed on the surface of the substrate core, connected with the metal pads and covered by the solder resist layer,
   wherein each metal nail has a first end in direct contact with the substrate core and a second end protruding from the exposed surface of the corresponding metal pad so that the metal nails penetrate the corresponding metal pads but do not penetrate the substrate core and do not completely cover the exposed surface of the corresponding metal pad.

2. The substrate in accordance with claim 1, wherein the ball pads are arranged in an array.

3. The substrate in accordance with claim 1, wherein the ball pads are located at a plurality of corners of the surface of the substrate core.

4. The substrate in accordance with claim 3, wherein the ball pads are dummy pads without function of electrical transmission.

5. The substrate in accordance with claim 1, wherein the ball pads have thumbtack-like shapes.

6. The substrate in accordance with claim 1, wherein each metal nails has an embedded length so as not to penetrate the substrate core.

7. The substrate in accordance with claim 6, wherein the embedded length of the metal nails ranges between half and two third of thickness of the substrate core.

8. The substrate in accordance with claim 1, wherein the metal nails have shapes selected from the group consisting of round bars, square bars and screws.

9. The substrate in accordance with claim 1, wherein the metal pads are completely exposed from the solder resist layer to form NSMD pads.

10. The substrate in accordance with claim 1, wherein the metal pads are round pads.

11. A BGA package comprising a BGA package substrate as claimed in claim 1 and a plurality of solder balls, wherein the solder balls are mounted onto the ball pads, wherein the solder balls are bonded to the exposed surfaces of the corresponding metal pads and the second ends of the nails.

* * * * *